(12) United States Patent
Triantafillou et al.

(10) Patent No.: US 7,952,160 B2
(45) Date of Patent: May 31, 2011

(54) PACKAGED VOLTAGE REGULATOR AND INDUCTOR ARRAY

(75) Inventors: Nicholas D. Triantafillou, Portland, OR (US); Malay Trivedi, Chandler, AZ (US); Erik A. McShane, Phoenix, AZ (US); James T. Doyle, Prescott, AZ (US); Mark J. Kachmarek, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 457 days.

(21) Appl. No.: 11/968,115

(22) Filed: Dec. 31, 2007

(65) Prior Publication Data

US 2010/0033236 A1 Feb. 11, 2010

(51) Int. Cl.
*H01L 21/70* (2006.01)
(52) U.S. Cl. ........ 257/499; 257/528; 257/531; 257/723; 257/724; 257/E27.011; 438/121
(58) Field of Classification Search .................. 257/531, 257/723, 777, E27.011, E21.499, 678–734, 257/772–796, E23.011–E23.194, E21.022, 257/499, 528; 361/18, 600, 679.01, 821; 438/106, 110, 381, 393
See application file for complete search history.

(56) References Cited

U.S. PATENT DOCUMENTS

| | | | | |
|---|---|---|---|---|
| 6,150,724 | A | * | 11/2000 | Wenzel et al. ................. 257/777 |
| 6,278,264 | B1 | * | 8/2001 | Burstein et al. ............... 323/282 |
| 6,559,492 | B1 | | 5/2003 | Hazucha et al. |
| 6,600,296 | B2 | | 7/2003 | Hazucha |
| 6,617,890 | B1 | | 9/2003 | Chen et al. |
| 6,653,891 | B1 | | 11/2003 | Hazucha |
| 6,801,026 | B2 | | 10/2004 | Schrom et al. |
| 6,819,573 | B2 | | 11/2004 | Hazucha |
| 6,838,863 | B2 | | 1/2005 | Hazucha et al. |
| 7,030,676 | B2 | | 4/2006 | Hazucha et al. |
| 7,042,274 | B2 | | 5/2006 | Hazucha et al. |
| 7,098,766 | B2 | | 8/2006 | Gardner et al. |
| 7,199,617 | B1 | | 4/2007 | Schrom et al. |
| 7,208,963 | B2 | | 4/2007 | Schrom et al. |
| 7,212,021 | B2 | | 5/2007 | Karnik et al. |
| 7,224,203 | B2 | | 5/2007 | Hazucha et al. |
| 7,247,930 | B2 | | 7/2007 | Narendra et al. |
| 7,265,607 | B1 | | 9/2007 | Rajapandian et al. |
| 7,274,181 | B2 | | 9/2007 | Schrom et al. |
| 7,274,250 | B2 | | 9/2007 | Hazucha et al. |
| 2006/0088971 | A1 | | 4/2006 | Crawford et al. |
| 2006/0226556 | A1 | * | 10/2006 | Kurita et al. .................. 257/778 |

OTHER PUBLICATIONS

Ansi, Inc., "Fibre Channel Framing and Signaling (FC-FS)" Rev 1.90, Ch. 1-3, Apr. 9, 2003, 64 pp.
IEEE, Inc., "IEEE Std. 802.3-2002", Mar. 8, 2002, 33 pp.
IEEE, Inc., "IEEE Std. 802.11a-1999", 1999, 12 pp.
PCI SIG, "PCI Local Bus Specification", Rev. 2.3, Mar. 29, 2002, 123 pp.

* cited by examiner

*Primary Examiner* — Jasmine J Clark
(74) *Attorney, Agent, or Firm* — Konrad Raynes & Victor LLP

(57) ABSTRACT

Inductors packaged with a voltage regulator for an integrated circuit within the same package are deposited to a sufficient thickness to reduce resistance and improve the quality factor. Furthermore, the voltage regulator switches currents through the inductors at a relatively high frequency such that the overall size and inductances of the inductors may be reduced. As a consequence, integrating both the integrated circuits including a voltage regulator and associated inductor array in a single package is facilitated. Other embodiments are described and claimed.

15 Claims, 7 Drawing Sheets

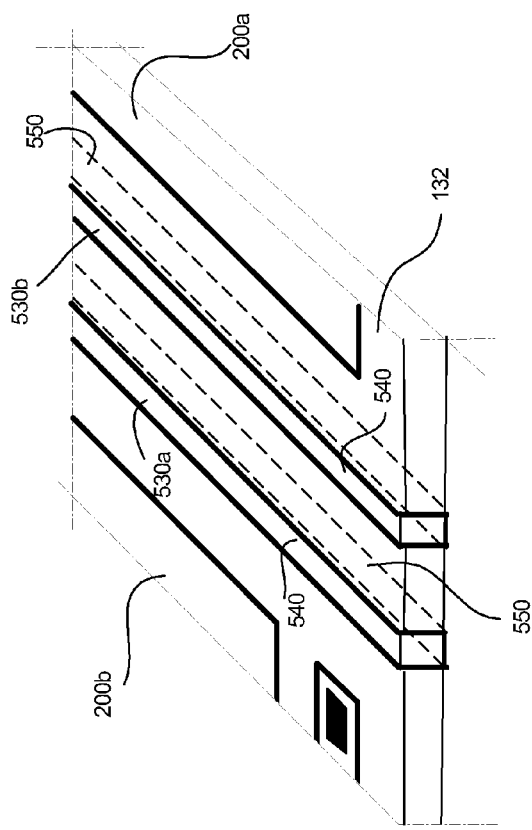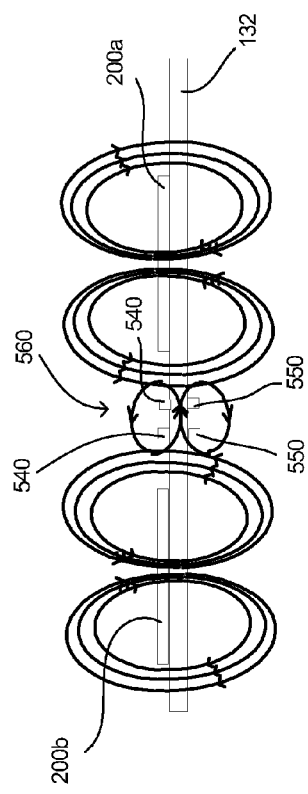

US 7,952,160 B2

PACKAGED VOLTAGE REGULATOR AND INDUCTOR ARRAY

BACKGROUND

Semiconductor devices frequently utilize discrete inductors which are typically placed external to the integrated circuit die or chip and external to the package containing the integrated circuit die. As a result, long interconnects are usually provided to connect the inductor to the die. These interconnects can frequently have high impedances and can result in large ohmic losses. Also, in high-density circuit board fabrication, it is often difficult to provide sufficient space outside the die package for the discrete inductors.

Integrated inductors may be formed by depositing one or more metal layers in or on a package substrate or a die substrate. Thus, a spiral wound inductor can be deposited in a single conductive metal layer on a substrate. However, spiral inductors tend to be relatively large, occupying valuable substrate space, in order to provide sufficient inductance for the particular application. Multiturn inductors may also be formed in a helix configuration in which windings are deposited in multiple layers embedded in the substrate. However, such multilayer structures can be difficult and expensive to manufacture. Furthermore, integrated inductors tend to have high resistances which can adversely affect the quality factor. As a result, the quality factor of the inductor may be relatively low such that the inductors may be too lossy for some applications such as power delivery.

BRIEF DESCRIPTION OF THE DRAWINGS

The drawings:

FIG. 1b is a schematic assembly diagram of the embodiment of FIG. 1a;

FIG. 8 illustrates an embodiment in which conductors are oriented orthogonally to planar inductors to promote isolation;

FIG. 9 illustrates flux lines of magnetic fields of the embodiment of FIG. 8.

DETAILED DESCRIPTION

Figure 1A:
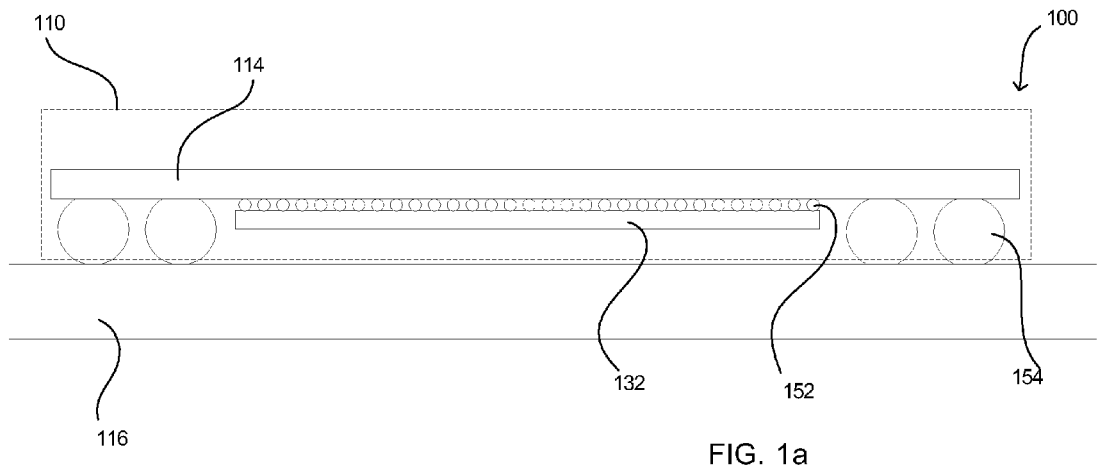
FIG. 1a is a schematic diagram indicating one embodiment of a device in accordance with the present description.
Figure 1B:
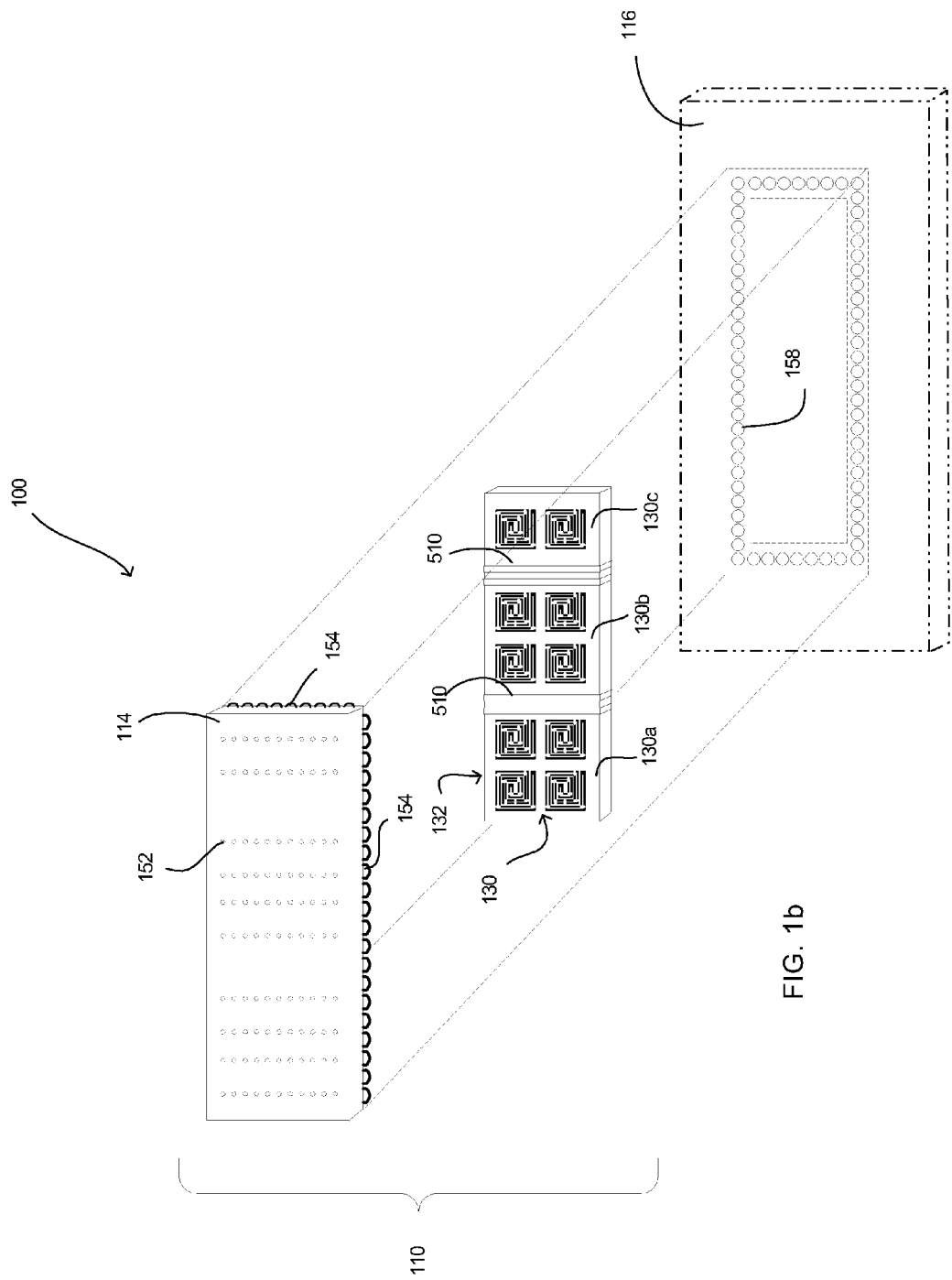

FIGS. 1a, 1b show one embodiment of a semiconductor device 100 in accordance with the present description. In this example, the device 100 includes a package 110 having disposed therein a semiconductor die 114. The package 110 may have one or more substrates and is disposed on a printed circuit board 116 such as a motherboard, daughterboard or other printed circuit board.

The semiconductor die 114 has an integrated circuit as represented by the schematic element 120 (FIG. 2) which includes a switched voltage regulator 122. In accordance with one aspect of the present description, the package 110 further has an array 130 (FIG. 1b) of planar inductors on board the package 110 and electrically coupled to the switched voltage regulator 122.

As explained in greater detail below, the inductors of the array 130 are planar inductors deposited to a sufficient thickness to reduce resistance and improve the quality factor. Furthermore, the voltage regulator switches currents through the inductors at a relatively high frequency such that the overall size and inductances of the inductors may be reduced. As a consequence, integrating both the integrated circuits including a voltage regulator and associated inductor array in a single package is facilitated. It is appreciated that a device in accordance with the present description may realize other features, depending upon the particular application.

In the illustrated embodiment, the package 110 has a substrate 132 on which the array 130 of inductors is disposed. The substrate 132 may be represented by the schematic element 134 in the diagram of FIG. 2. In this example, the substrate is a glass substrate and the inductors are air core inductors. It is appreciated that the array 130 of inductors may be formed on a variety of substrates including other insulative substrates such as silicon dioxide, and semiconductor dies and substrates including gallium arsenide and silicon, as well as other materials, depending upon the particular application. It is further appreciated that cores of various other materials may be provided as well.

Thus, in another embodiment, the array 130 of inductors may be formed on the die 114 of the package 110, instead of a separate substrate 132 of the package 110. In such an embodiment, the die 114 may be represented by a schematic element 140 (FIG. 2) and both the voltage regulator 122 and the array 130 of inductors may be formed on the same die 114. In yet another embodiment, the voltage regulator 122 and the array 130 of inductors may be formed on different dies which may be represented by schematic elements 142 and 134, respectively.

The package 110 further has a first layer of interconnects 152 disposed between the semiconductor die 114 and the substrate 132, electrically connecting the integrated circuits of the semiconductor die 114 to the inductor array 130 disposed on the substrate 132. In this manner, the inductor array 130 is electrically connected to the voltage regulator 122 of the integrated circuit of the die 114. A second layer of interconnects 154 is disposed between the die 114 and the printed circuit board 116. In this manner, the integrated circuit of the die 114, is electrically connected to the conductors of the printed circuit board 116.

The interconnects 152, 154 may be any suitable electrical conductors such as solder, wires, lands, plated vias, and plugs. In the illustrated embodiment, the interconnects 152 are solder balls or bumps arranged in a grid often referred to as a ball grid array (BGA) in the interior of the underside of the die 114. The solder balls 152 of the die 114 may be soldered or otherwise coupled to the inductors of the inductor array 130 of the substrate 132 as appropriate.

The interconnects 154 of the die 114 of the illustrated embodiment are copper pillars which are arranged around the periphery of the die 114 to provide more than one row of connections. The interconnects 154 may be larger than the solder balls 152 to provide increased current carrying capability, and may be soldered or otherwise directly coupled to lands 158 (FIG. 1b) or other contacts, or received in sockets or other contacts, of the circuit board 116 for example.

As explained in greater detail below, the die 114, inductor array substrate 132 and the circuit board 116 of the device 100 when assembled in this manner, form a sandwich structure which can be relatively thin in many applications as compared to inductors packaged and mounted next to a die on a circuit board, for example. In addition, planar inductors and selective isolation between selected inductors can be provided in the same processing layout. In addition, the inductor substrate 132 can, depending upon the particular application, serve as a package as well as the interconnect and housing.

Figure 3:
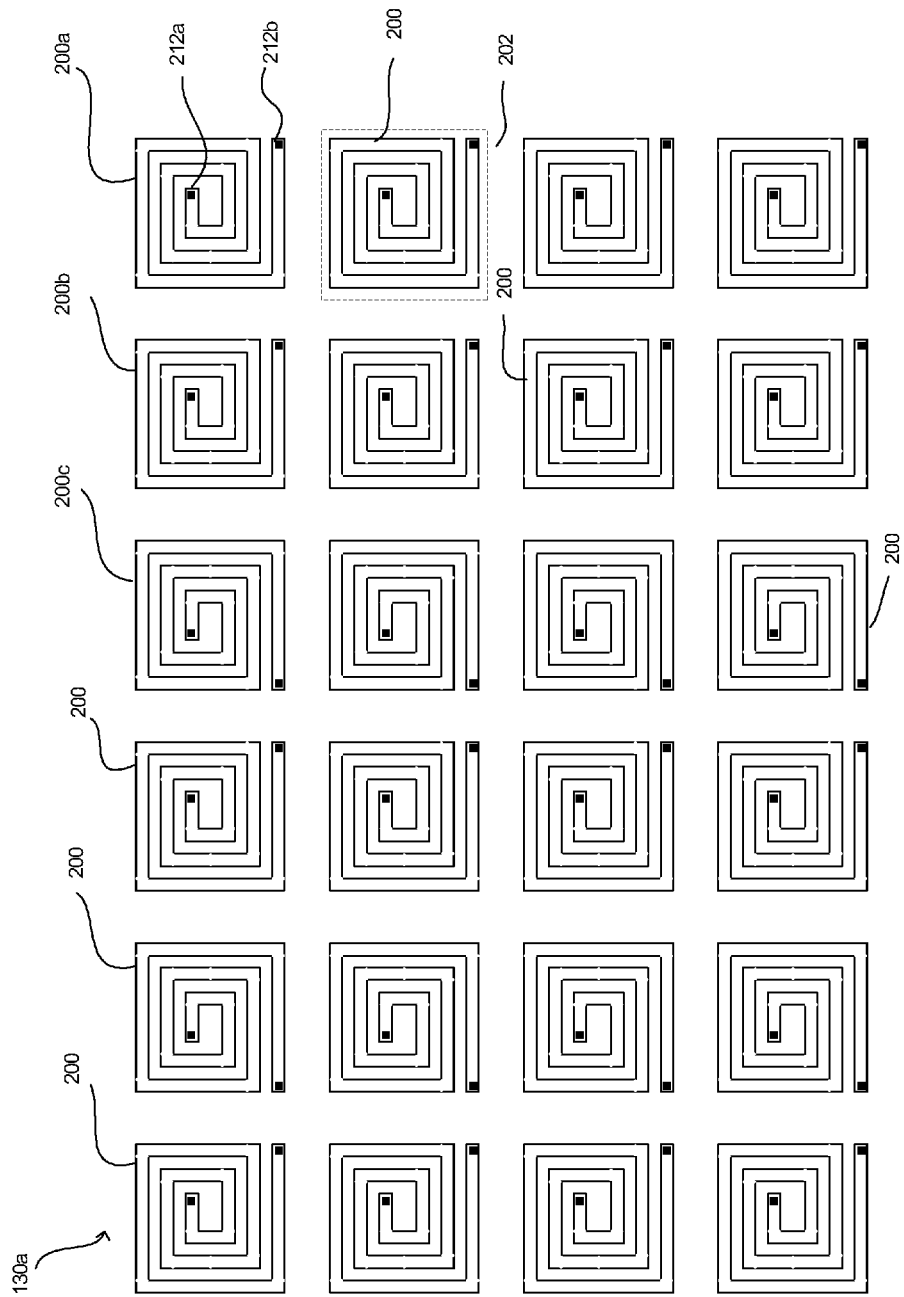
FIG. 3 is a schematic diagram of an inductor array for the device of FIG. 1.

Referring to FIG. 3, one embodiment of an array 130 of inductors includes a plurality of inductors 200 which are arranged in a rectangular array 130a of rows and columns. It is appreciated that the inductors 200 may be arranged in other configurations including regular and irregular configurations. For example, the inductors 200 may be arranged in an array of a single column or single row of inductors. One embodiment of an inductor array 130 can include approximately 9-10,000 inductors 200 in accordance with the present description. In the illustrated embodiment of FIG. 3, each inductor 200 is a planar spiral inductor having an inductance within a range of 1-5 nanohenries and occupies a surface area 202 of the substrate 132 within a range of 50-150 square microns. Thus, for example, the inductors 200 each have an inductance of 3 nanohenries and a surface area of 100 square microns. It is appreciated that the size and inductance of the inductors 200 may vary, depending upon the particular application.

In accordance with one aspect of the present description, the voltage regulator 122 switches currents through the inductors 200 at a rate of 50-150 MHz. For example, the currents may be switched by the voltage regulator at a frequency of 100 MHz. It is believed that such high frequency switching rates facilitate use of inductors of relatively small size and small inductance.

In accordance with another aspect of the present description, the inductors 200 are deposited on the substrate 132 to a thickness within a range of 40-80 microns. In the illustrated embodiment, the inductors 200 each have a thickness of conductive metal such as copper of 65 microns. It is appreciated that the thickness and type of conductive material may vary, depending upon the particular application.

In one embodiment, inductors may be deposited or formed in a single process which facilitates similar behavior of the inductors of the array. It is appreciated that the inductors may be formed to have different behaviors, depending upon the particular application.

Figure 2:
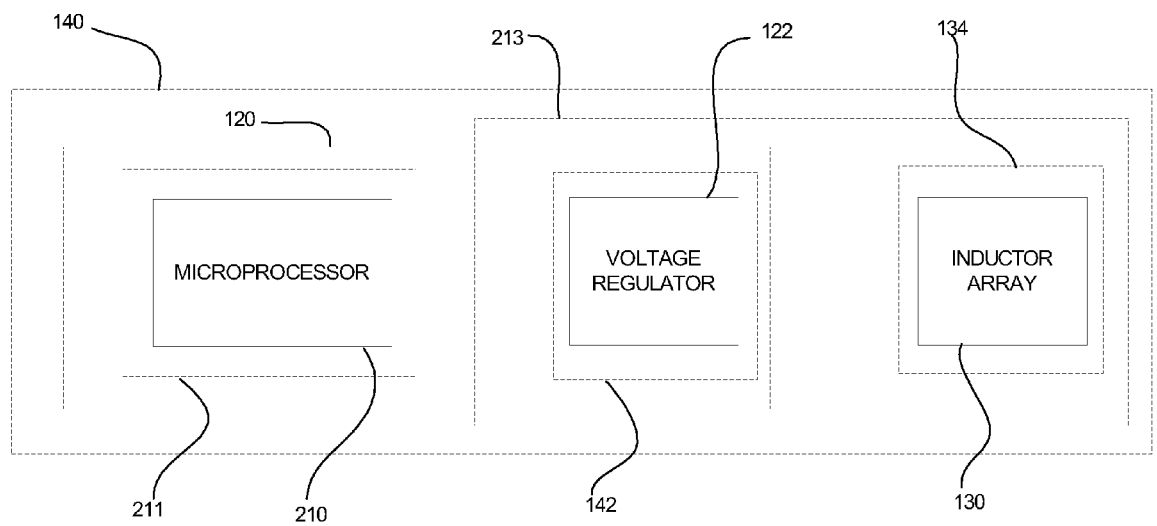
FIG. 2 is a schematic diagram illustrating examples of various layouts of devices in accordance with the present description.

The array 130 may be readily incorporated into the same package 110 containing the integrated circuit voltage regulator 122. As a consequence, both the voltage regulator 122 and its associated inductor array 130 may be positioned in close proximity to the integrated circuits being powered by the voltage regulator 122. In one embodiment, the die 114 may include an integrated circuit such as a microprocessor 210 (FIG. 2). Thus, in one embodiment, both the microprocessor 210 and the voltage regulator 122 may be disposed on the same die 114 as represented by the schematic element 120, and the substrate 132 carrying the inductor array 130 may be disposed in the same package 110 as the die 114. Such an arrangement, it is believed, can be relatively thin and significantly reduce transmission and other losses, thereby increasing efficiency and improving battery life in portable applications.

In another embodiment, the microprocessor 210 and the voltage regulator 122 may be disposed on separate dies as represented by the schematic elements 211, and 142, respectively, and the substrate 132 carrying the inductor array 130 may be disposed in the same package 110 as the elements 211, 142. In yet another embodiment, the microprocessor 210 may be disposed on one die as represented by the schematic element 211, and the voltage regulator 122 and the inductor array 130 may be disposed on the same die as represented by the schematic element 213, which may be disposed in the same package 110 as the element 211.

In the array 130, each inductor 200 can be connected to another inductor 200 in series, in parallel, and/or to devices external to the array, either in the package 110 or external to the package 110. Series connections of an inductor 200 can be used to create inductance values equal to the sum of the inductors 200 connected in series. Also, an inductor 200 in the inductor array 130 can be connected to another inductor 200 in parallel to tune the effective inductance of the combined inductors 200 connected together to a certain predetermined inductance. An individual inductor 200 in the inductor array 130, a combination of serially connected inductors 200, a combination of inductors 200 connected in parallel, or a combination of inductors 200 connected in series and in parallel can be used to connect to devices external to the inductor array 130. Examples of devices external to the inductor array 300 that could be connected to the inductors 200 include capacitors, voltage regulator modules, resistors, transistors and other devices useful in electronic design. Capacitors, and other passives may be disposed directly on the substrate 132 or in other locations of the package 110. Also, embodiments of the inductor array 130 can have the inductors 200 oriented on their side, upside down, or in other positions.

Each inductor 200 is a planar spiral inductor having turns wound in one of a first direction and a second direction opposite that of the first direction. The inductors 200 may be positioned in the array so that a portion of adjacent inductors, such as inductors 200a and 200b, for example, have turns wound in the same direction and a portion of adjacent inductors, such as inductors 200b and 200c, for example, have turns wound in opposite directions.

Each inductor 200 has a first input/output connection 212a and a second input/output connection 212b so that a current may be injected through the inductor by switching circuits in either a clockwise or counterclockwise direction. As a consequence, the flux generated by an individual inductor is a function of both the direction of the turns and the direction of the current injected into the turns of the inductor 200.

The voltage regulator 122 includes current switching circuits adapted to inject current into selected inductors 200 of the array 130 so that at least a portion of flux generated by adjacent selected inductors 200 is selectively reinforced or cancelled as a function of injected current direction through each selected inductor and turn direction in each selected inductor. The inductors 200 may be permanently interconnected in selected configurations or may be variably connected using appropriate switching circuits.

In one example of operations of a device in accordance with the present description, a voltage supplied to an integrated circuit disposed on a die packaged in a package, may be regulated using a switched voltage regulator disposed on the die. One example of such a package is the package 110 which includes die 114 having an integrated circuit which includes a microprocessor 210 and a switched voltage regulator 122. The voltage regulating operation includes switching currents supplied to a plurality of inductors, such as the inductors 200 of the array 130, which are packaged in the same package as the die and electrically coupled to the switched voltage regulator.

Figure 4A:
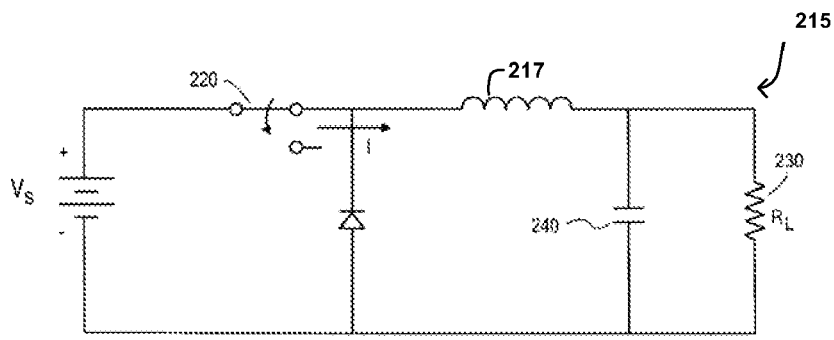
FIG. 4a is a circuit diagram of an embodiment of a buck converter circuit with the switch in the on position.
Figure 4B:
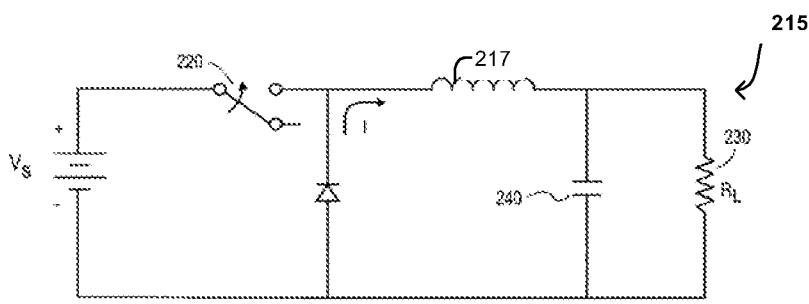
FIG. 4b is a circuit diagram of an embodiment of a buck converter circuit with the switch in the off position.

For example, the switched voltage regulator 122 may include a buck converter circuit 215 as shown in FIGS. 4a and 4b. In the buck converter circuit 215 one or more inductors 200 of the array 130 (as represented by a single inductor symbol 217) and a capacitor 240 act as energy storage devices when the switch 220 is in the on position as shown in FIG. 4a. Once the switch 220 is placed in the off position, as shown in FIG. 4b, the inductor or inductors represented by the symbol 217 act like a source and work to maintain the current through the load resistor 230. Similarly, the capacitor 240 works to maintain the voltage across the load resistor 230.

In one embodiment, integrated voltage regulation technology may be provided involving, in one example, high speed dc/dc pulse width modulator (PWM) dc/dc converters (>10 MHz, for example). Implementation of high speed PWM technology facilitates integration of voltage regulator controllers, drivers, FETs, as well as inductors and capacitors in a single device, for example.

Figure 5:
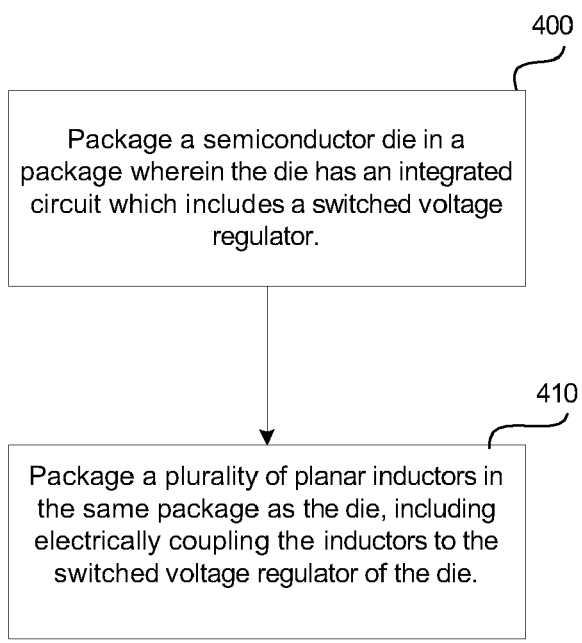
FIG. 5 is a flowchart depicting one embodiment of operations to fabricate a device in accordance with the present description.

FIG. 5 shows an example of operations to package a device in accordance with the present description. In one operation, a semiconductor die is packaged (block 400) in a package wherein the die has an integrated circuit which includes a switched voltage regulator. One example of such a package is the package 110 which includes die 114 having an integrated circuit which includes a microprocessor 210 and a switched voltage regulator 122.

In another operation, a plurality of planar inductors such as the inductors 200 of the array 130, is packaged (block 410) in the same package as the die. The inductor packaging operation includes electrically coupling the inductors to the switched voltage regulator of the die. In one illustrated embodiment, the inductor packaging operation includes packaging a substrate such as the substrate 132 on which the inductors are disposed.

In the embodiment of FIG. 1, the substrate 132 carrying the inductors 200 is coupled to the die 114 by flip-chip solder bumps 152. The inductors 200 may be coupled to the die 114 by other bonding techniques including a bumpless build-up layer (BBUL), or wire bond. In a BBUL embodiment, the package 110 may be built up around the inductor array 130, so the inductor array is contained on or within a package substrate. Plated vias or other interconnects may also be used to electrically connect the inductor array 130 to the die 114 itself or to external devices on the motherboard. Thus, the interconnects can include but are not limited to metal leads, solder bumps, or wire in formations such as a pin grid array, a ball grid array, a ceramic column grid array, a leadless grid array, or a land grid array.

The inductors may be formed utilizing any suitable deposition or other fabrication process. One such conductive film deposition process is marketed by TriQuint Semiconductor, Inc. Other fabrication processes may be used, depending upon the particular application.

One fabrication method of the inductor 200 can be achieved through a modified version of a conventional high-density interconnect process which includes forming a layer of conductive material and processing the layer to form the inductors of the array. For example, the conductive layer may be formed as a seed layer. A photoresist mask may be applied using well-known masking, exposing, and developing techniques over a conductive layer to define the inductors 200 of the array 130. In an embodiment, the conductive layer can be formed of a material such as copper, tungsten, or aluminum or other conductive materials. For example, in an embodiment using copper, well-know techniques such as electroplating, depositing and printing can be used. The photoresist mask may be removed using well-known techniques and the exposed conductive layer may thus be selectively etched away to produce the structures shown in FIG. 3 or FIG. 1b.

Figure 7A:
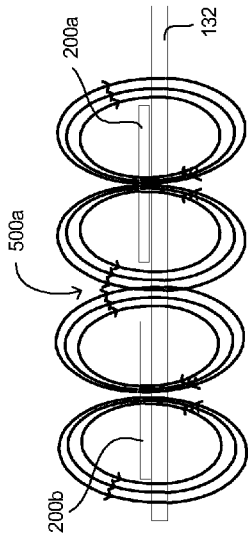
FIGS. 7a-7c illustrate flux lines of magnetic fields of the embodiments of FIGS. 6a-6c, illustrating mutual coupling and isolation.
Figure 6A:
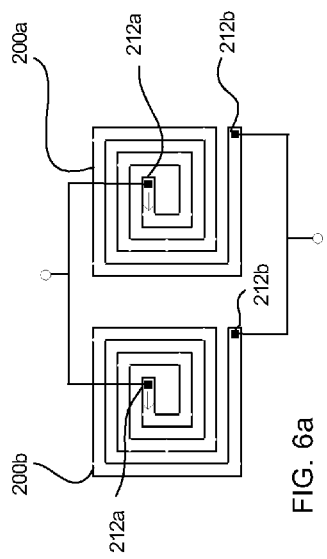
FIGS. 6a-6c illustrate various embodiments in which current is selectively injected for mutual coupling and isolation.

Current passing through the inductors generates magnetic fields which can interact with magnetic fields of adjacent inductors. The magnetic fields can be mutually reinforcing or cancelling, depending upon the direction of the currents and the orientations of the inductors. FIG. 6a shows an example in which the currents flowing through two adjacent inductors 200a, 200b are flowing in the same direction (from input 212a to output 212b) and the inductor windings are wound in the same orientation. As shown in FIG. 7a, the magnetic fields between the inductors 200a, 200b as represented by the flux lines 500a are mutually coupled and mutually reinforcing, thereby affecting the inductances exhibited by the inductors 200a, 200b.

Figure 7B:
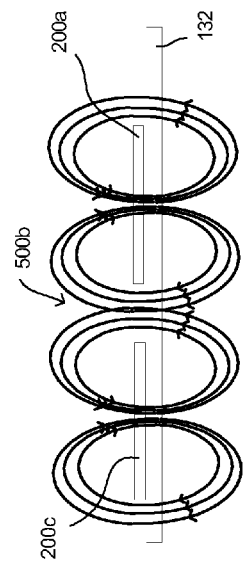
Figure 6B:
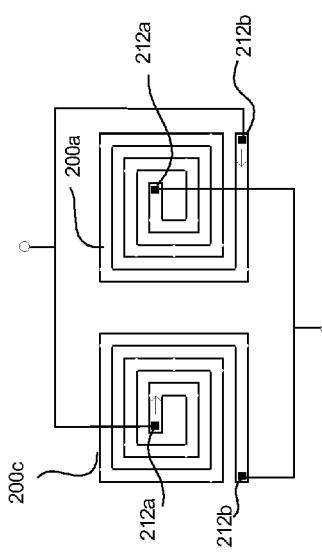

FIGS. 6b and 7b show another example of mutually reinforcing magnetic fields. However, in this example, current is injected to flow through inductor 200a in one direction (from input 212b to output 212a) and current is injected to flow through adjacent inductor 200c in the other direction (from input 212a to output 212b). However, because the windings of the two adjacent inductors 200a, 200c are wound in opposite directions, the magnetic fields between the inductors 200a, 200c as represented by the flux lines 500b are again mutually coupled and mutually reinforcing, thereby affecting the inductances exhibited by the inductors 200a, 200c.

Figure 7C:
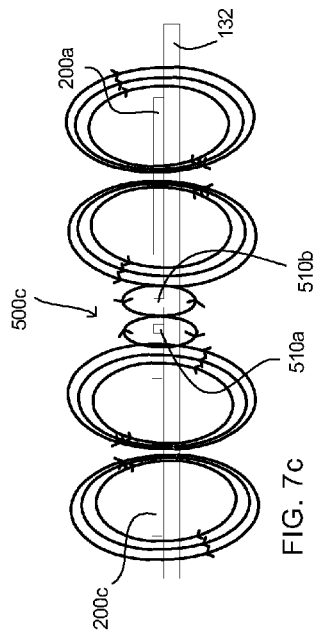
Figure 6C:
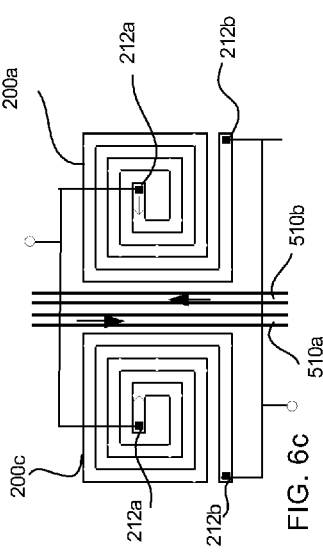

Conversely, the magnetic fields of adjacent inductors can cancel, thereby magnetically isolating the two inductors. FIGS. 6c and 7c show an example in which the currents flowing through two adjacent inductors 200a, 200c are injected to flow in the same direction (from input 212a to output 212b). However, the inductor windings of the inductors 200a, 200c are wound in opposite orientations. As a consequence, as shown in FIG. 7c, the magnetic fields between the inductors 200a, 200c as represented by the flux lines 500c are isolating and mutually cancelling, thereby affecting the inductances exhibited by the inductors 200a, 200c.

Such isolation can also be effected or facilitated by providing planar conductors on the substrate 132 between selected adjacent inductors. FIG. 6c shows an example in which a pair of planar conductors or rails 510a, 510b are provided between adjacent inductors 200a, 200c. Current may be injected to flow in opposite directions so that the magnetic fields of the conductors 510a, 510b cancel as shown in FIG. 7c. It is appreciated that the planar conductors and the currents through those conductors may be arranged to reinforce magnetic fields of adjacent inductors as well.

FIGS. 8, 9 show another example of providing conductors between adjacent inductors to aid or cancel magnetic fields as appropriate. In the example of FIGS. 8, 9, a plurality of orthogonally oriented conductors 530a, 530b are disposed on the substrate 132. The conductor 530a has a planar portion 540 on the top of the substrate 132 and a planar portion 550 on the bottom of the substrate 132. The top and bottom portions 540, 550 are electrically coupled together to form a winding which is oriented orthogonally to the windings of the inductors 200a, 200b of the inductor array 130. The conductor 530b may be disposed on the substrate 132 in a similar manner to form a winding which is oriented orthogonally to the windings of the inductors 200a, 200b of the inductor array 130. The magnetic fields 560 of the conductors 530a, 530b may aid or cancel adjacent magnetic fields of adjacent inductors as shown in FIG. 9.

Rail or orthogonally oriented conductors may be utilized to isolate the array 130 into separate subsections as illustrated in FIG. 1b. As shown therein, the array 130 includes separate subsections 130a, 130b, 130c, isolated by planar conductors 510.

Novelty of this approach includes the combination of inductors in arrays which are coupled or non coupled. Coupled inductors can provide addition efficiency (recovered energy loss) as well as lower ripple. If the energy is recombined out of phases additional supply filtering results.

Coupling and isolating inductors can facilitate the breakout of many sub phases in a multiphase switching regulator. In one application, the launch may be staggered to reduce parasitic inductance. In addition, a combination of high Q inductance in the interconnect path resulting from up and down U-shaped paths in a multilayer package can provide higher inductance thus greater power delivery capability. It is appreciated that other applications may have different features.

Figure 10:
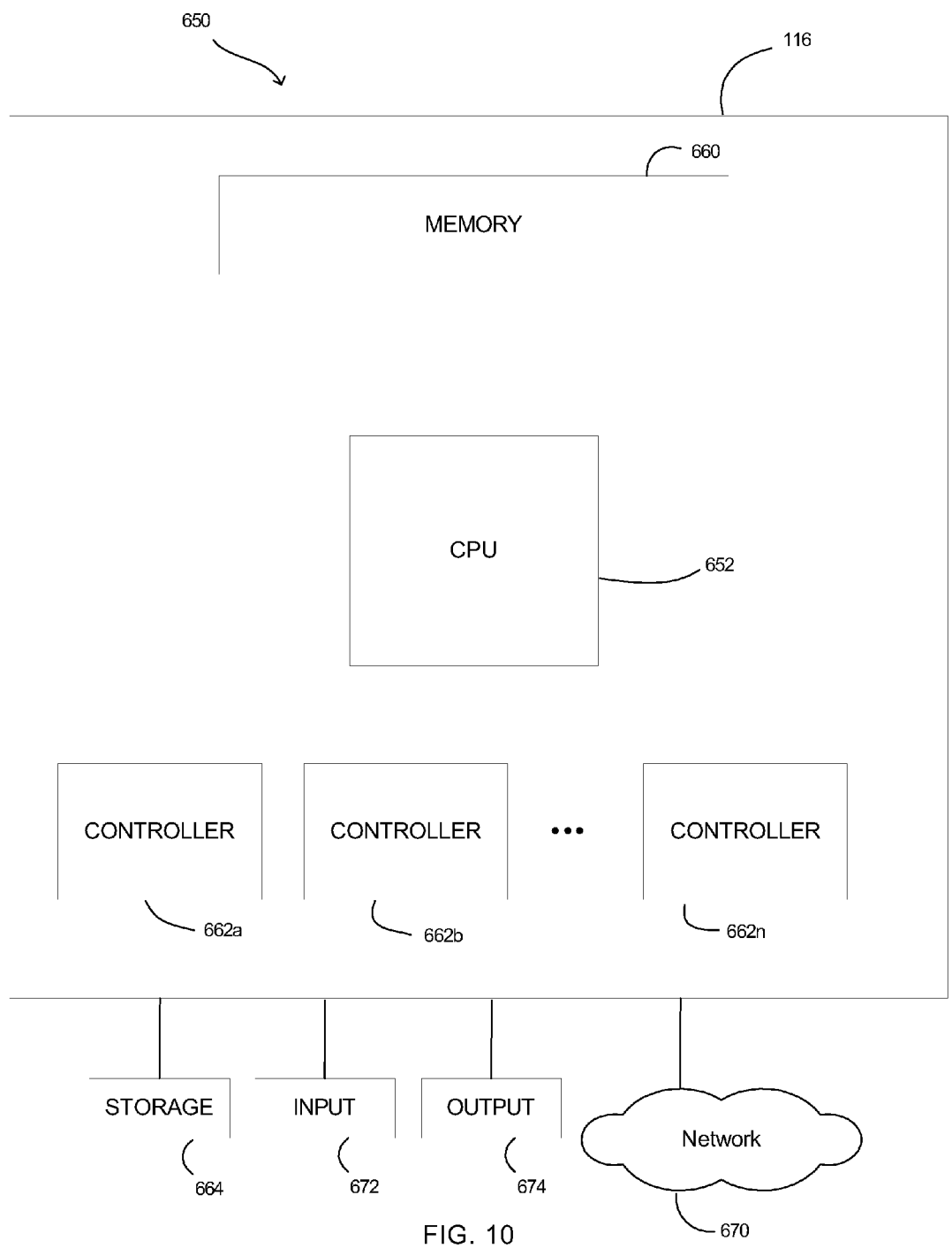
FIG. 10 is a schematic diagram illustrating an example of a system in accordance with the present description.

FIG. 10 illustrates an example of a computing environment in which aspects of described embodiments may be embodied. A computer 650 includes one or more electronic devices including a central processing unit (CPU) 652 (only one is shown), a memory 660 (e.g., a volatile memory device), and a plurality of controllers 662a, 662b . . . 662n. One or more of the CPU 652, memory 660 and controllers 662a, 662b . . . 662n are disposed in one or more packages which are disposed on one or more printed circuit boards or other substrates 116. One such package is represented by the package 110 which has a substrate 112 and a semiconductor die 114 which includes an integrated circuit having a switched voltage regulator 122 and an array 130 of planar inductors on board the package 110 and electrically coupled to the switched voltage regulator 122.

The printed circuit board 116 may be a single layer or multi-layered motherboard which has a plurality of conductors that provide communication between the circuits in the device 100 and other components mounted to the board 116. Alternatively, one or more of the CPU 652, memory 660 and controllers 662a, 662b . . . 662n may be disposed on other substrates such as daughter cards or expansion cards or any other substrate suitable for supporting a die, package or other substrate.

An operating system and various applications execute on the CPU 652 and reside in the memory 660. The content residing in memory 660 may be cached in accordance with appropriate caching techniques. Programs and data in memory 660 may be swapped into storage 664 (e.g., a non-volatile storage, such as magnetic disk drives, optical disk drives, a tape drive, etc.) as part of memory management operations. The computer 650 may comprise any computing device, such as a mainframe, server, personal computer, workstation, laptop, handheld computer, telephony device, network appliance, virtualization device, storage controller, network controller, etc.

Any suitable CPU 652 and operating system may be used. For example, CPU 652 may represent any of a wide variety of control logic including, but not limited to one or more of a microprocessor, a programmable logic device (PLD), programmable logic array (PLA), application specific integrated circuit (ASIC), a microcontroller, and the like, although the present description is not limited in this respect. In one embodiment, CPU 652 includes one or more Intel® compatible processors. Processors of CPU 652 may have an instruction set containing a plurality of machine level instructions that may be invoked, for example by an application or operating system.

The controllers 662a, 662b . . . 662n may include a system controller, peripheral controller, memory controller, hub controller, I/O bus controller, video controller, network controller, storage controller, etc. For example, a storage controller can control the reading of data from and the writing of data to the storage 664 in accordance with a storage protocol layer. The storage protocol layer may be any of a number of suitable storage protocols. Data being written to or read from the storage 664 may be cached in accordance with appropriate caching techniques.

A network controller can include one or more protocol layers to send and receive network packets to and from remote devices over a network 670. The network 670 may comprise a Local Area Network (LAN), the Internet, a Wide Area Network (WAN), Storage Area Network (SAN), etc. Embodiments may be configured to transmit data over a wireless network or connection. In certain embodiments, the network controller and various protocol layers may employ the Ethernet protocol over unshielded twisted pair cable, token ring protocol, Fibre Channel protocol, etc., or any other suitable network communication protocol. In some embodiments, the computer 650 may not be connected to a network 670 or may lack storage 664.

A video controller can render information on a display monitor, and may be embodied on a video card or integrated on integrated circuit components mounted on the motherboard. Certain of the devices may have multiple cards or controllers. An input device 672 is used to provide user input to the computer 650, and may include a keyboard, mouse, pen-stylus, microphone, touch sensitive display screen, or any other suitable activation or input mechanism. An output device 674 is capable of rendering information transmitted from the processor CPU 652, or other component, such as a display monitor, printer, storage, speaker, etc.

In certain embodiments, a packaged inductor array in accordance with the present description may be embodied in a computer system including a video controller to render information to display on a monitor coupled to a computer system comprising a desktop, workstation, server, mainframe, laptop, handheld computer, etc. Alternatively, the packaged inductor array embodiments may be embodied in a computing device that does not include a video controller, such as a switch, router, etc.

A network controller or other devices described herein may be mounted on an expansion card, such as a Peripheral Component Interconnect (PCI) card, PCI-express or some other I/O expansion card coupled to a motherboard, or on integrated circuit components mounted on the motherboard. Integrated circuit dies may be packaged individually, or packaged with other dies in stacks or other arrangements within a package. Thus, packaged inductor array embodiments may be embodied in computer systems or other systems in which one or more packages in accordance with the present description are disposed on one or both of a motherboard and an expansion card. Accordingly, in some system embodiments, the system may lack an expansion card, and a device in accordance with the present description may be disposed on a motherboard. In another system embodiment, a device in accordance with the present description may be disposed on an expansion card but not on a motherboard.

Details on the PCI architecture are described in "PCI Local Bus, Rev. 2.3", published by the PCI-SIG. Details on the Fibre Channel architecture are described in the technology specification "Fibre Channel Framing and Signaling Interface", document no. ISO/IEC AWI 14165-25. Details on the Ethernet protocol are described in publications including "IEEE std. 802.3," published Mar. 8, 2002, and "IEEE std. 802.11," published 1999-2003.

Additional Embodiment Details

The illustrated operations of FIG. 5 show certain events occurring in a certain order. In alternative embodiments, certain operations may be performed in a different order, modified or removed. Moreover, operations may be added to the above described operations and still conform to the described embodiments. Further, operations described herein may occur sequentially or certain operations may be processed in parallel. The foregoing description of various embodiments has been presented for the purposes of illustration and explanation. It is not intended to be exhaustive or to limit to the precise form disclosed. Many modifications and variations are possible in light of the above teaching.

What is claimed is:

1. A semiconductor device, comprising:
    a package having a semiconductor die disposed in said package and said die having an integrated circuit which includes a switched voltage regulator; and said package further having a plurality of integrated planar inductors on board said package and electrically coupled to said switched voltage regulator.

2. The device of claim 1 wherein said package has a substrate and said plurality of inductors are disposed on said substrate.

3. The device of claim 2 wherein said package further has a first layer of interconnects disposed between said semiconductor die and said package substrate.

4. The device of claim 1 wherein said plurality of inductors are arranged in a rectangular array of rows and columns.

5. The device of claim 1 wherein each inductor is a planar spiral inductor having an inductance within a range of 1-5 nanohenries and an area within a range of 50-150 square microns.

6. The device of claim 1 wherein said voltage regulator is adapted to switch currents through said inductors at a rate of 50-150 MHz.

7. The device of claim 2 wherein said inductors are planar inductors deposited on said substrate and have a thickness within a range of 40-80 microns.

8. The device of claim 1 further comprising a motherboard and a layer of interconnects electrically connecting said die to said motherboard, and wherein said integrated circuit includes a microprocessor.

9. The device of claim 1 wherein each inductor is a planar spiral inductor having turns wound in one of a first direction and a second direction opposite that of said first direction, said inductors being positioned in an array in which a portion of adjacent inductors have turns wound in the same direction and a portion of adjacent inductors have turns wound in opposite directions, said voltage regulator including current switching circuits adapted to inject current into selected inductors so that at least a portion of flux generated by adjacent selected inductors is selectively reinforced or cancelled as a function of injected current direction through each selected inductor and turn direction in each selected inductor.

10. A method, comprising:
    packaging a semiconductor die in a package wherein the die has an integrated circuit which includes a switched voltage regulator; and
    packaging a plurality of integrated planar inductors in the same package as said die, including electrically coupling said inductors to said switched voltage regulator of said die.

11. The method of claim 10 wherein said packaging of said inductors includes packaging a glass substrate on which said inductors are disposed in said package.

12. The method of claim 10 wherein said electrically coupling includes interconnecting with an array of solder balls.

13. A method, comprising:
    regulating a voltage supplied to an integrated circuit disposed on a die packaged in a package using a switched voltage regulator disposed on said die, said regulating including switching currents supplied to a plurality of integrated inductors packaged in the same package as said die and electrically coupled to said switched voltage regulator.

14. The method of claim 13 wherein each inductor is a planar spiral inductor having an inductance within a range of 1-5 nanohenries and an area within a range of 50-150 square microns and wherein said current switching includes switching currents through said inductors at a rate of 50-150 MHz.

15. The method of claim 13 wherein each inductor is a planar spiral inductor having turns wound in one of a first direction and a second direction opposite that of said first direction, said inductors being positioned in an array of in which a portion of adjacent inductors have turns wound in the same direction and a portion of adjacent inductors have turns wound in opposite directions, said current switching including injecting current into selected inductors so that at least a portion of flux generated by adjacent selected inductors is selectively reinforced or cancelled as a function of injected current direction through each selected inductor and turn direction in each selected inductor.

* * * * *